United States Patent Office 3,846,181
Patented Nov. 5, 1974

3,846,181

SEMICONDUCTOR WAFER STABILIZATION PROCESS AND STABILIZATION SOLUTION THEREFOR

Dervin L. Flowers, Scottsdale, Ariz., assignor to Motorola, Inc., Chicago, Ill.

No Drawing. Filed Oct. 23, 1973, Ser. No. 408,776
Int. Cl. H01l 7/34
U.S. Cl. 148—1.5 5 Claims

ABSTRACT OF THE DISCLOSURE

A process for the stabilization of a semiconductor die or wafer which includes the step of coating said die or wafer with a solution of boron/phosphorous/vanadium/silicate complex The solution is prepared by mixing phosphorous pentoxide in an alcohol solvent. The dissolution of the phosphorous pentoxide is exothermic and the temperature of the solution will rise during the reaction. Then boric anhydride and vanadium pentoxide are added to the solution. Then appropriately diluted tetraethyl orthosilicate in an appropriate quantity is added to the solution. The more tetraethyl orthosilicate that is added the more glassy the resultant coating will be.

BACKGROUND OF THE INVENTION

This invention relates to the processing of semiconductor dies or wafers and more particularly to the stabilization or passivation thereof.

The operating characteristics of a semiconductor device must remain relatively stable throughout its life. Typically, planar silicon devices have been stabilized by growing a passivating layer, such as silicon dioxide, on the surface of the body of semiconductor material, whereat the PN junctions terminate. Such passivating layers substantially improve the performance of the semiconductor device. The stability of the operating characteristics of the devices are also known to be further improved by diffusing beneficial impurities into the semiconductor material and its passivating layer.

Another form of passivation is a vapor deposited glass containing such a beneficial impurity as is disclosed in U.S. Pat. No. 3,476,619, assigned to the same assignee as herein. Such a chemically deposited glass requires processing at relatively high temperatures in controlled gaseous environments. For example, in accordance with the foregoing patent, a wafer is held at a temperature of 425° C.–450° C. while a gaseous mixture containing phosphine, silane and oxygen is passed thereover.

SUMMARY OF THE INVENTION

It is an object of this invention to provide an improved process for the stabilization of semiconductor dies or wafers and a solution therefor.

It is a further object of this invention to provide an improved stabilization process for semiconductor dies or wafers which is performed at a low temperature under ambient conditions.

It is a further object of this invention to provide an improved process for the stabilization of semiconductor dies or wafers which requires only a simple coating step.

A still further object of the invention is to provide a process for the preparation of the improved stabilization coating solution and the coating solution per se.

In accordance with these objects, there is provided a coating solution which comprises a complex silicate containing phosphorous, boron and vanadium dissolved in a solution of an appropriate alcohol. The solution may also contain gold, rhodium and platinum to further enhance the stabilization of the semiconductor surface. The improved process includes the step of coating a semiconductor die or wafer either before or after die and/or wire bonding, with the foregoing coating solution.

Further objects and advantages of the invention will be understood from the following complete description thereof.

COMPLETE DESCRIPTION

In accordance with the invention there is provided a composition and a process for passivating, sealing and gettering a finished semiconductor wafer or device, before or after die attach and/or wire bonding. The composition and process may be used alone or in combination with more conventional glassed surfaces as a passivator or getter for every type of semiconductor device, particularly silicon devices. In certain cases, the composition and process may be used to recover slightly or seriously contaminated die or wafers which are nominally but imperfectly passivated. The process and composition may further be used to enhance the voltage stability in diode packages by virtue of sealing complex ohmic contacts from ambient sealing corrosion.

In accordance with the invention, the coating solution is prepared by dissolving phosphorous pentoxide ($P_2O_5$) in an appropriate solvent such as absolute methyl, ethyl or isopropyl alcohol. The solution may be stirred or the container shaken to hasten solution which is complete in a short period of time. The dissolution of the material is exothermic and the temperature of the solution will rise. Boric anhydride ($B_2O_3$) is then added to the solution and stirred or shaken. Solution will be slower than the previous dissolution of the phosphorous pentoxide, requiring several minutes for completion. It should be noted that phosphoric acid is not a substitute for phosphorous pentoxide, nor is boric acid a substitute for the boric anhydride, since with substitution of either of the foregoing materials, solution is not affected. Thus, there is a reacting interaction between the phosphorous and boron moieties as follows:

$$P_2O_5 + B_2O_3 \longrightarrow -\overset{|}{\underset{|}{P}}-O-B=$$

The reaction is apparently a transanhydride or esterification type conversion.

Vanadium pentoxide is added to the solution and is only sparingly soluble therein. However, after a period of about one day, the solution will turn bright yellow, indicating dissolution of the vanadium pentoxide. It is to be further noted that the vanadium pentoxide cannot be added to the solution prior to the boric anhydride. This indicates that a further reaction interaction is occurring as follows:

$$-\overset{|}{\underset{|}{P}}-O-\overset{|}{\underset{|}{B}} + V_2O_5 \longrightarrow -\overset{|}{\underset{|}{P}}-O-\overset{}{\underset{|}{B}}-O-\overset{|}{\underset{|}{V}}=$$

Following dissolution of the vanadium pentoxide, the solution may be diluted with an alcohol prior to adding an appropriate amount of tetraethyl orthosilicate solution. The amount of tetraethyl orthosilicate is variable within broad limits, depending on the character or stability of the coating solution required.

In general, the solution may contain 1 to 30 grams per liter of phosphorous pentoxide, 1 to 60 grams per liter of boric anhydride and .005 to 5.0 grams per liter vanadium pentoxide or vanadium trioxide, together with 0.1 to 50 milliliters per liter tetraethyl orthosilicate diluted in a solvent selected from the group consisting of methyl, ethyl, propyl, isopropyl, butyl, and isobutyl alcohol, ethylene glycol or tetrahydro furfuryl alcohol.

The foregoing solution may be placed on semiconductor wafers of dice by a spin-on or other appropriate coating process, following which the dice or wafers are finished by a bake, sinter or fusion, preferably in an atmosphere containing ammonia, the ammonia serving to apparently stabilize the solution during drying or bake, then resulting in an adherent glass-like passivating layer.

The process and solution may be used for various coating steps, either prior to or after die coat and attach, in accordance with the following specific examples.

EXAMPLE I 16 grams of phosphorous pentoxide was dissolved in 800 milliliters of isopropyl alcohol (reagent grade). To this solution was added 28 grams of boric anhydride, the ratio of boron to phosphorous being 3.5 to 1. Following complete dissolution of the boric anhydride, 0.5 grams of vanadium pentoxide was added. To this solution was added 0.5 milliliters of tetraethyl orthosilicate diluted in 200 milliliters of isopropyl alcohol. The solution was applied to 100 semiconductor dice lying face up on appropriate surfaces by dropping enough solution over the dice to cover them. The solution was allowed to evaporate. The dice were then baked at 200° in a forced air draft oven for three hours. They were then cooled and treated for ten minutes in concentrated ammonium hydroxide and rinsed with water and then again rinsed with methanol. The dice were then die attached and wire bonded in a conventional manner to lead frames and encapsulated by transfer molding in a conventional epoxy package. Fifty of the resulting devices were then subjected to a humidity bias temperature test (85% relative humidity, 85° C., −30 v. bias with no power dissipation). Fifty devices treated in a conventional manner were used as a control. In the control case, 10 percent failure was noted by devices being open-circuited at 500 hours. Those devices which were treated in accordance with the invention took 1000 hours before the 10 percent failure mark was reached.

EXAMPLE II

Into a solution prepared as in Example I, 50 die-attached and wire bonded semiconductor dice were soaked at 23° C. for 15 minutes to allow complete wetting, and physical chemisorption. The solution was then poured off of the semiconductor devices and the devices were air dried without rinsing, following which the devices were baked for 30 minutes at 200° C. The devices were epoxy encapsulated, utilizing 50 conventionally produced devices as a control group, both sets of devices were humidity temperature bias tested under conditions as in Example I, with a −5 v. bias. The 10 percent failure rate for the untreated devices was 1700 while the devices treated in accordance with the invention did not show this open point until 2500 hours.

A similar useful solution may contain 1 to 30 grams per liter of phosphorous pentoxide, 1 to 60 grams per liter of boric anhydride, .005 to 5.0 grams per liter vanadium pentoxide or vanadium trioxide and 0 to 10 grams per liter of a material selected from the group consisting of gold, palladium or rhodium salts or oxides, together with 0.1 to 60 milliliters per liter tetraethyl orthosilicate. A solvent selected from the group consisting of methyl, ethyl, propyl, isopropyl, butyl, and isobutyl alcohol, ethylene glycol or tetrahydrofurfuryl alcohol may be used.

The results from the additional gold, palladium or rhodium are shown in the following examples.

EXAMPLE III

To the solution of Example I, 5 grams of gold chloride is substituted for the vanadium pentoxide. Integrated circuit chips which had already failed previous electric tests were coated with this solution and the solution of Example I was utilized on another group. With the solution of Example I, 25 devices out of 100 then passed the electrical tests. With the solution of this example, 27 devices out of 100 passed.

EXAMPLE IV

To the solution of Example I, .5 grams of gold chloride was added. Another lot of devices as used in Example III was coated with this solution with 44 out of 100 devices then passing the electrical tests.

In addition to the uses aforestated, the composition and process may be used in dielectric isolation of electroactive components in a complex hybrid or monolithic array, used to seal gratuitous and undetected pinholes in an oxidized or glass passivated silicon surface present by virtue of dirt in films and acting through holes in the resist; used to remedy the defects of over-etching or cracking of passivation layers which allow units to degrade in the encapsulation or sealing process; used to getter devices of unwanted and deleterious contamination arising in routine production handling before, during and after die attach and wire bonding; used on button or bump contact devices such as diodes to either be a passivating layer or repair damaged films; and used to prevent channeling in N or P diode devices or PNP transistors.

While the invention has been disclosed by way of certain preferred embodiments and examples thereof, it will be appreciated that suitable modifications may be made therein without departing from the spirit and scope of the invention.

What is claimed is:

1. In a process of manufacturing semiconductor devices which includes the steps of forming P-N junctions in a surface of a semiconductor substrate which junctions extend to the surface of said substrate and covering said junctions with a passivation layer on the surface of said wafer, the improvement which comprises the step of coating the semiconductor device with a complex silicate solution containing 1 to 30 grams per liter phosphorous pentoxide, 1 to 60 grams per liter boric anhydride, .005 to 5.0 grams per liter vanadium oxide, 0.01 to 50 milliliters per liter tetraethylorthosilicate and the balance an organic solvent.

2. In a process as recited in Claim 1 wherein said coating step includes immersing the semiconductor device in said complex silicate solution and drying the device in an atmosphere containing ammonia.

3. In a process as recited in Claim 1 wherein said coating step includes covering the surface of said semiconductor device with said complex silicate solution, drying said device, and rinsing the surface of said device with concentrated ammonium hydroxide.

4. In a process as recited in Claim 3 wherein the temperature of drying is approximately 200° C.

5. A stabilizing coating solution for semiconductor devices consisting essentially of:

(a) 1 to 30 grams per liter of phosphorus pentoxide;
(b) 1 to 60 grams per liter of boric anhydride;
(c) .005 to 5.0 grams per liter of vanadium oxide;
(d) 0 to 10 grams per liter of a material selected from the group consisting of gold, palladium and rhodium salts and oxides;
(e) 0.1 to 60 milliliters per liter of tetraethyl orthosilicate; and
(f) the balance, a solvent selected from the group consisting of methyl, ethyl, propyl, isopropyl, butyl, and isobutyl alcohol, ethylene glycol, and tetrahydro furfuryl alcohol.

References Cited

UNITED STATES PATENTS

| | | | |
|---|---|---|---|
| 3,352,712 | 11/1967 | Polinsky et al. | 117—201 |
| 3,549,433 | 12/1970 | Renner et al. | 148—1.5 X |
| 3,577,286 | 5/1971 | Berkenblit et al. | 148—1.5 X |
| 3,759,761 | 9/1973 | Mori et al. | 148—187 |

L. DEWAYNE RUTLEDGE, Primary Examiner
J. M. DAVIS, Assistant Examiner

U.S. Cl. X.R.

117—201; 148—187; 252—182, 351